United States Patent [19]

Fletcher et al.

[11] 3,906,231

[45] Sept. 16, 1975

[54] DOPED JOSEPHSON TUNNELING JUNCTION FOR USE IN A SENSITIVE IR DETECTOR

[76] Inventors: James C. Fletcher, Administrator of the National Aeronautics and Space Administration with respect to an invention of; Melvin M. Saffren, Altadena, Calif.

[22] Filed: Mar. 19, 1974

[21] Appl. No.: 452,770

[52] U.S. Cl. ...................... 250/338; 250/370; 357/5
[51] Int. Cl.² ........................................ H01L 39/22
[58] Field of Search ......... 250/338; 357/5, 370, 371

[56] References Cited

UNITED STATES PATENTS

| | | | |
|---|---|---|---|
| 3,673,071 | 6/1972 | Pritchard, Jr. et al. | 357/5 X |
| 3,725,213 | 4/1973 | Pierce | 357/5 X |
| 3,733,526 | 5/1973 | Anacher et al. | 357/5 |
| 3,803,459 | 4/1974 | Matisoo | 357/5 |

*Primary Examiner*—Archie R. Borchelt
*Attorney, Agent, or Firm*—Monte F. Mott; Paul F. McCaul; John R. Manning

[57] ABSTRACT

A superconductive tunneling device having a modified tunnel barrier capable of supporting Josephson tunneling current is provided. The tunnel barrier located between a pair of electrodes includes a molecular species which is capable of coupling incident radiation of a spectrum characteristic of the molecular species into the tunnel barrier. The coupled radiation modulates the known Josephson characteristics of the superconducting device. As a result of the present invention, a superconductive tunneling device can be tuned or made sensitive to a particular radiation associated with the dopant molecular species. The present invention is particularly useful in providing an improved infrared detector. The tunnel barrier region can be, for example, an oxide of an electrode or frozen gas. The molecular species can be intermixed with the barrier region such as the frozen gas or deposited as one or more layers of molecules on the barrier region. The deposited molecules of the molecular species are unbonded and capable of responding to a radiation characteristic of the molecules. Semi-conductor material can be utilized as the molecular species to provide an increased selective bandwidth response. Finally, appropriate detector equipment can be utilized to measure the modulation of any of the Josephson characteristics such as critical current, voltage steps, Lambe-Jaklevic peaks and plasma frequency.

29 Claims, 6 Drawing Figures

FIG. 2

DOPED JOSEPHSON TUNNELING JUNCTION FOR USE IN A SENSITIVE IR DETECTOR

BACKGROUND OF THE INVENTION

1. Origin of the Invention

The invention described herein was made in the performance of work under a NASA contract and is subject to the provisions of Section 305 of the National Aeronautics and Space Act of 1958, Public Law 85-568 (72 Stat. 435; 43 U.S.C. 2457).

2. Field of the Invention

The present invention generally relates to a Josephson tunnel junction and more particularly to the detection of infrared microwave radiation with a doped Josephson junction detector.

3. Description of the Prior Art

Generally, infrared detectors can be characterized by three basic parameters: spectral range, response time, and threshold power detection. These parameters have been the focus of improvement ever since Hershel's discovery of infrared at the beginning of the nineteenth century to the present indium antimonide detectors commercially utilized today.

Recently, there have been attempts to utilize superconductive materials in a cryogenic environment as an infrared sensitive detector. For example, the Altshuler et al. U.S. Pat. No. 3,435,137 suggests that the inpact of infrared radiation can cause a superconductor to pass from a transition state into a normal conducting state permitting the penetration of a magnetic field to rotate an indicator light. Other forms of energy detectors relying on the properties of a superconductive material are described in the Kleppner U.S. Pat. No. 3,691,381 and Scharnhorst U.S. Pat. No. 3,740,690.

Since the date of B. D. Josephson's discovery that if two superconducting regions were separated by a thin normal region they could produce a D. C. supercurrent at zero voltage, see PHYSICS LETTERS, vol. 1, page 251 (1962), a large amount of experimentation has been performed on this phenomena. In Joesphson's initial work, he mathematically treated his system of two superconductors separated by a barrier by a model based upon electron tunneling, which leads to an interpretation of zero-voltage current as tunneling by Cooper pairs. The maximum zero-voltage current being that current at which sufficient energy is supplied to the pairs to exceed their condensation energy in the barrier.

Subsequent work, e.g. "Coupled superconductors" REVS. MOD. PHYS. vol. 36, pages 216–220, (1964) has suggested a model based in terms of weakly coupled superconductors, described by means of the Ginzburg-Landau theory. Actual experimental work has been performed on Josephson devices in a number of areas, for example, it has been suggested to utilize the Josephson tunneling phenomenon for the detection of low voltages at liquid helium temperatures and as a superconductive logic element. Of particular interest with respect to the present invention is the work performed by C. C. Grimes, T. L. Richards, and S. Shapiro on the use of Josephson point contact junctions as far infrared detectors, see "Far Infrared Response of Point-Contact Josephson Junctions," Physical Review Letters, vol. 17, No. 8, (1966) and "Josephson-Effect Far-Infrared Detector," Journal of Applied Physics, vol. 39, No. 8, (1968). The work of Grimes et al. has utilized point contact Josephson junctions that took advantage of the fact that direct current can be driven through a Josephson junction without developing any voltage across the junction. When, however, the junction is exposed to an electromagnetic field, the D. C. voltage-current characteristics is modified and thus, the Josephson point contact junction can be used as a detector of radiation. The prime emphasis of this work was directed at frequencies up to and beyond the superconducting energy gap of the Josephson point contact. Basically, the Grimes et al device utilized an adjustable point contact Josephson junction that was immersed directly in liquid helium. The Josephson point junctions were formed by pressing together the ends of two superconducting wires, one of which was flat, the other pointed. The spectral response of the Josephson point contact junctions were studies by using them as detectors in a far infrared Fourier transform spectrometer in which they were irradiated by broadband, incoherent radiation. The response of NB-NB (niobuim) junctions were found to extend to frequencies above 40 cm.$^{-1}$ ($\lambda < 250u$), i.e., to about twice the superconducting energy gap. The radiation diminished the maximum amount of zero voltage current that could flow through the junction and measurements using a Klystron source at 2.5 cm.$^{-1}$ ($\lambda = 4$ mm.), yielded a value of 5 $10^{-13}$ W for the noise equivalent power in a one-cycle band-width and showed the junction detector could follow a pulse signal which has a rise time of 10 nsec. Experiments using a monochromatic laser source at 32.2 cm.$^{-1}$ showed the appearance of constant voltage steps in the voltage-current characteristic of the Josephson point contact junction, as is well known at microwave frequencies. These experiments demonstrate the existence of the Jospehson effect at frequencies up to and beyond the superconducting energy gap, and show that over this range of frequencies, a Josephson point contact junction detector exhibited both high sensitivity and high speed when compared with other helium-temperature far-infrared detectors.

Other electrodynamic aspects of the Josephson tunnel junctions have been the subject of both theoretical and experimental studies in recent years. For example, there has been a recent observation of the predicted plasma resonance in Josephson tunnel junctions by Dahm et al. in their paper, "Study of the Josephson Plasma Resonance", Physical Review Letters, volume 20, number 16 (April, 1968). The work of Dahm et al disclosed for typical junction parameters that the plasma frequency was in the order of $10^{10}$ to $10^{12}$ Hz depending on the junction capacitance. The plasma frequency was reduced as the D. C. current through the Josephson junction was increased towards its critical value.

The fabrication of Josephson junction devices are well known in the prior art by various forms of sputtering, evaporative and vacuum deposition methods as set forth in the Anacher et al. U.S. Pat. No. 3,733,526.

Thus, the prior art can be summarized as utilizing Josephson point contact junctions consisting of two superconducting wires pressed against each other as a far-infrared detector.

OBJECTS AND SUMMARY OF THE INVENTION

It is a primary object of the present invention to provide a Josephson junction having a uniquely formed barrier region.

It is another object of the present invention to provide a particularly sensitive IR detector of the Josephson junction type.

It is a further object of the present invention to utilize a Josephson junction device that is capable of resonance coupling at a characteristic radiation of a molecular species included as a thin layer in the barrier region.

It is yet another object of the present invention to provide an IR detector utilizing a Josephson junction device having a base electrode made of lead with a thin insulating layer of lead oxide supporting a suitable molecular species added for increasing sensitivity to IR sources containing the same characteristic radiation of the molecular species.

It is still another object of the present invention to provide an IR detector utilizing a Josephson junction device having semi-conductor material deposited in the barrier region for increasing sensitivity to a selected bandwidth of radiation.

It is yet a further object of the present invention to provide an IR detector utilizing a Josephson junction having a frozen gas as an insulator barrier between metal electrodes with the inclusion of a molecular species in the frozen gas to improve IR sensitivity.

It is an additional object of the present invention to provide an IR detecting Josephson device wherein the insulator or barrier region could be extended beyond the electrodes to act as an antenna for receiving incoming radiation.

A still further object of the present invention is to detect radiation by measurement of modulations of the Josephson characteristics such as plasma frequency, critical current, voltage steps or Lambe-Jaklevic peaks.

Briefly described, the present invention involves the use of a Josephson junction device having a thin dopant layer such as a mono-layer or several layers of molecules of a molecular species in the barrier region which serves the purpose of increasing the resonance coupling of the Josephson junction at the characteristic radiation of the molecular species. The particular insulating barrier region can comprise, for example, an oxide of the electrode such as lead oxide or a frozen gas such as argon of the noble gas family.

More particularly, the subject invention includes a superconductive tunneling device including a first and second superconducting electrode with a tunnel barrier sufficiently thin to allow Josephson tunneling current therethrough located between the first and second electrodes. The tunnel barrier region can be, for example, a lead oxide or a frozen gas. The barrier further includes means for increasing the sensitivity of the tunneling device to radiant energy including a molecular species located between the first and second electrodes capable of coupling incident radiation into the barrier of a spectrum characteristic of that molecular species. Semi-conductor material can be utilized as the molecular species to provide a selective bandwidth response.

The increase sensitivity of the Josephson junction to incident radiation can be determined by measuring the modulation of one or more characteristics of the junction; e.g., critical current, voltage, plasma frequency and Lambe-Jaklevic peaks.

Further objects and the many attendant advantages of the invention may be best understood by reference to the following detailed description taken in conjunction with the accompanying drawings in which like reference symbols designate like parts throughout the figures thereof.

DESCRIPTION OF THE PREFERRED EMBODIMENT

Figure 1:
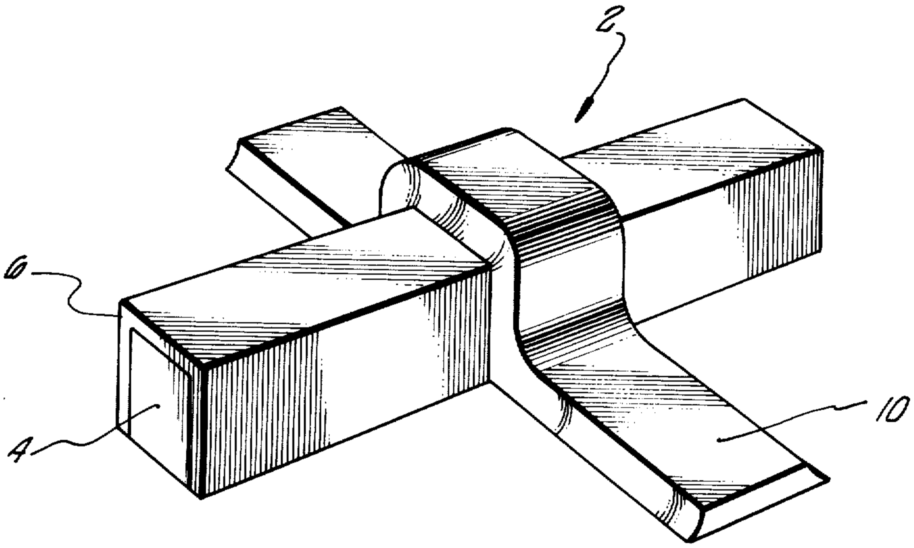
FIG. 1 is a perspective view of a Josephson junction containing a molecular species dopant in its barrier region.

The theoretical explanation for the three prime advantages of the present invention, that is, increased coupling of radiation to junctions, making junctions more selective in their response to radiation, and extending the response of the junctions to radiation of shorter wavelengths can be found in a modified transfer Hamiltonian model. While a detailed development of the mathematical model explaining the theory of the present invention is not necessary for a person skilled in the art to reproduce this invention, reference is made to an article entitled "Theory of Photon Assisted Tunnelling and Superconducting Junctions with Active Parrier Impurities" Physical Review B, volume 8, No. 1 (July, 1973) by R. D. Sherman. This article was prepared in accordance with the work supervised and suggested by the present inventor and is incorporated herein to supplement the present disclosure.

The applications of the improved Josephson junction of the presesnt invention are numerous. For example, a sensitive tuned infrared detector could be useful in conducting satellite earth survey, astronomical observation and spacecraft observation of planetary surfaces and atmospheres, identification of chemical compounds, communications and infrared astronomy. The extreme sensitivity of these detectors would permit greater angular resolution, limited only be diffraction, permitting better estimation of the size of discrete infrared astronomical sources, and better spatial resolution of the infrared emission from the planets and extended astronomical sources. An array of the unique Josephson junctions of the present invention could be utilized to provide an efficient detection of individual molecular species present in a subject source. For example, the radiation from a planet's atmosphere could be scanned across the array of junctions to detect various frequencies. Each of the individual junctions of the array would be capable of responding to a particular characteristic radiation.

Because the inventive detector could be "resonant" or tuned to a characteristic radiation or spectrum of the dopant molecular species in the barrier region of its superconductor junction, it would permit accurate determination of the constituents of planetary atmospheres and their distribution and similar results for the constituents of interstellar gas clouds. Tuned detectors could furthermore be conveniently used on earth for detection of complicated organic molecules, e.g., drug detection and for the sensing of atmosphere pollutants. The subject molecules under investigation may, for example, be sufficiently thermally excited to provide emitted radiation, or could be stimulated or excited to give off a characteristic radiation which would impinge on the active Josephson junction or junctions of the present invention. If the subject radiation is characteristics of the dopant molecular species, the resultant resonance or coupling of the radiation into the barrier region of the junction will produce a detectable modulation of a measurable Josephson characteristic such as voltage, current or plasma frequency. The wavelength range of detection is feasibly as low as 1 u.

Figure 2:
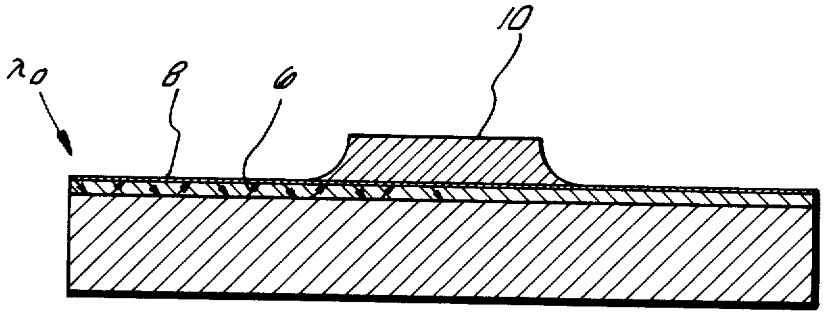
FIG. 2 is a cross sectional view of the Josephson junction of FIG. 1.

The following description discloses the principal steps followed in building the Josephson junction of the present invention. Referring to FIGS. 1 and 2, an active or doped Josephson junction 2 is disclosed comprising a base electrode 4 of a superconducting metal such as lead. The base electrode 4 can be deposited on an appropriate substrate such as glass (not shown) having an appropriately cleansed surface. The deposition of the lead can be by a sputtering or evaporation technique as is well known in the prior art, see U.S. Pat. No. 3,733,526. The thickness of the base electrode 4 would be approximately in the range of 500 to 1000 Angstroms.

A thin insulating layer of an oxide such as lead oxide is deposited on the base electrode 4 by, for example, sputtering. The lead oxide layer forms the barrier region 6 of the junction 2 and will be generally in the range of 20 to 30 Angstroms in thickness. Conventionally, the barrier region of Josephson junctions is about 0 to 50 Angstroms. Basically, the barrier region 6 must be thin enough to permit a characteristic Josephson critical current. Other forms of barrier material will subsequently be discussed.

The desired dopant of molecular species 8 can then be deposited and can have a thickness of approximately a mono-layer of molecules. If the desired molecular species 8 is water, it can be deposited by, for example, exposing the base electrode 4 to water vapor which would permeate interstices in the porous surface of the base electrode 4. The molecular species 8 are physically absorbed into the barrier region 6.

The manner of providing the desired molecular species 8 between the electrodes is not important but the presence of the molecular species 8 in a relatively unbonded state to form active coupling sites with characteristically incident radiation in the barrier region is important.

Just as various types of superconducting metals, such as tin, aluminum, tantalum, etc. and various types of barrier regions can be used in the present invention, so can various molecular species 8 be inserted into the barrier region. The following molecular species dopants are presented for purposes of illustration only and are not to be considered as limiting the present invention:

| MOLECULE | WAVE-LENGTH, mm |
|---|---|
| $H_2O$ | 0.94 |
| | 1.54 |
| $H_2S$ | 0.718 |
| | 0.764 |

-Continued

| MOLECULE | WAVE-LENGTH, mm |
|---|---|
| | 0.814 |
| | 1.00 |
| | 1.39 |
| HCl | 0.483 |
| | 0.241 |

The above molecular species dopants are capable of providing an increased sensitivity for one or more characteristic wavelengths of radiation.

As an alternative embodiment of the present invention, it is possible to utilize a semi-conductor material of the type used for infrared detection as the molecular species to provide a Josephson junction with a response over a selective bandwidth. For example, the semi-conductor material utilized in conventional infrared detectors, such as indium antimonide, cadium sulfide, lead sulfide and gallium arsenide could be sputtered onto the barrier region 6 in a crystalline or non-crystalline state to provide an active layer of approximatly three or four molecules of thickness. The inclusion of the semi-conductor material in the barrier region 6 as the active molecular species 8 provides an efficient coupling of characteristic incident radiation with the tunneling electrons. In essence, electrons in the semi-conductor material are promoted to a more excited state and can interact with tunneling electrons and thereby make the entire junction more sensitive to the incident radiation. This interaction is much the same as the occurrence with the discrete molecules except with semi-conductor material, the excited states form a continual rather than a discrete spectrum.

Finally, a second electrode 10 is deposited over the insulating barrier 6 by sputtering or evaporation. This electrode 10 is approximately 500 Angstroms thick and is, more importantly, transparent to that radiation characteristic of the dopant molecular species 8.

The actual square area of the active Josephson junction can be approximately $1 \times 10^{-6}$ square inches. It is believed that the smaller the area of the active junction transverse to the direction of the incident radiation, the greater transmission of the incident radiation into the barrier region.

As an alternative barrier region between the electrodes 4 and 10, it is possible to fabricate the Josephson junction with a frozen gas barrier region, for example, from the noble inert family of gases such as argon. The use of a frozen gas barrier will have an advantage of permitting an extremely precise control of the thickness of the barrier region 6. After a base electrode 4 such as aluminum is deposited in a chamber capable of being cooled down to the superconducting temperature region under a very hard vaccum, the chamber would be evacuated. The substrate glass slide (not shown) would be heated to form a continuous metal film, and then cooled down again. The glass slide would then be maintained at the temperature of the superfluid He II phase of helium (under 2°K) by contact with a He II bath. A gas, such as argon, either by itself or containing the desired molecular species, such as water, would then be introduced into the chamber and a thin film would then condense and freeze on the metal electrode film previously deposited. The chamber would then be evacuated again, and a second layer of metal deposited over the frozen gas. The thickness of the metal electrode layers and of the gas film could be monitored by use of a quartz crystal microbalance. The molecular species could be deposited as a layer on the frozen gas barrier or since the gas is inert intermixed with the gas in an unbonded state and deposited so that the molecular species is scattered throughout the barrier region.

Figure 3:
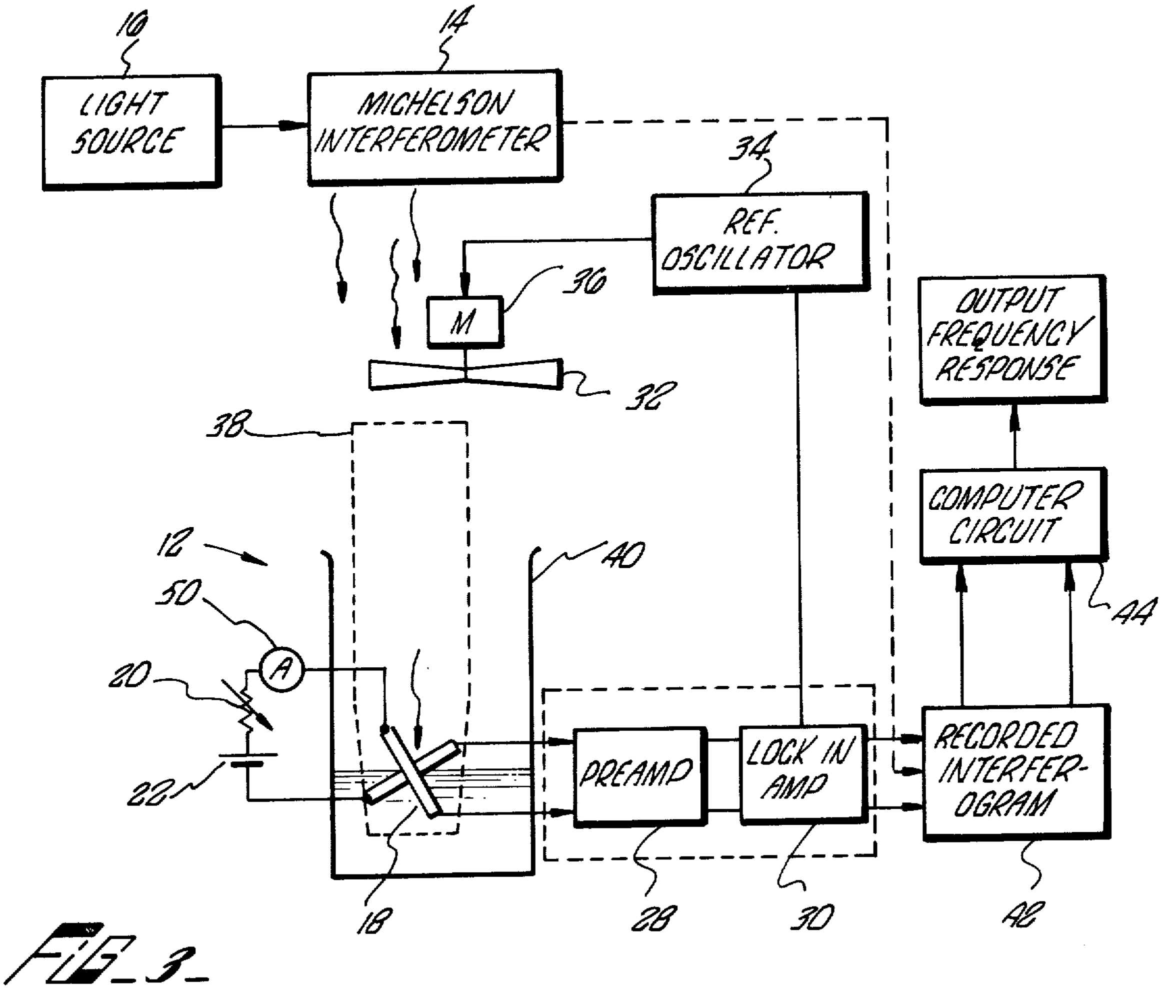
FIG. 3 is a schematic of a far-infrared detector with the Josephson junction of the present invention.

While the Josephson device with the dopant moleular species is unique by itself, one of the principle uses of this device will be in combination with conventional monitoring apparatus to serve as a far-infrared detector. Referring to FIG. 3, a suggested schematic of a testing and calibrating arrangement for a type of far-infrared detector 12 of the present invention is disclosed using a Michelson interferometer 14. The interferometer 14 is disclosed simply to provide a controlled variation of wavelength across a desired bandwidth from a light source 16 such as a mercury arc lamp to test the response of a Josephson junction 18. Alternatively a monochromatic source of frequency could be utilized such as a $CO_2$ laser to match, for example, the appropriate molecular species dopant of $CO_2$.

Basically, the far-infrared detection device 12 comprises the molecular species doped Josephson junction 18, seen in more detail in FIGS. 1 and 2, immersed in the liquid helium of a cryostat or Dewar 40. Two arms of the junction 18 are connected to a junction bias circuit which consists of a variable resistor 20 and a source of D. C. voltage 22. The power lines of the circuit and the junction 18 can be shielded to minimize any undesired electrical transients.

The remaining two arms of the junction 18 are connected via appropriately shielded power lines to apparatus capable of detecting any variation of the voltage developed across the junction 18. As will be explained subsequently, the critical current flow or plasma frequency of the junction 18 could have been monitored as the detector output.

The bias current of the junction 18 is held fixed by adjustment of the variable resistor 20 at a point of high differential resistance to assure the maximum detectable voltage output. The exact desired bias current can be empirically determined depending on the particular junction and molecular species. Reference is made to the V-I curve of FIG. 4 wherein the bias current level is disclosed as the dotted line, $i_r$. Curve 24 discloses the V-I characteristic of the junction 18 in the absence of radiation while curve 26 discloses the shift of the V-I characteristic in the presence of the desired radiation.

Due to the infrared-active molecular species in the barrier of the tunnel junction 18, the sensitivity of the detector 12 to a characteristic radiation or spectrum of the molecular species is enhanced. This is believed to be the result of the enhanced coupling of infrared radiation into the Josephson junction 18 through the resonance or coupling of the active molecular species. Thus, it is believed that the current-voltage step structure can be experienced at minimal threshold levels of incident monochromatic radiation, for example, at levels less than $5 \times 10^{-13}$ W noise equivalent power. Accordingly, an infrared active Josephson junction 8 will have greater sensitivity than current infrared detectors, that is greater than $10^{-14}$ W/Hz with a response time greater than $10^{-8}$ seconds. While not shown, it should be readily apparent to those skilled in the art that an appropriately filtered or gated detector signal can insure that auxiliary incident radiation of a non-molecular species wavelength can be removed or distinguished from that of the tuned or resonant radiation of the desired molecular species.

Figure 4:
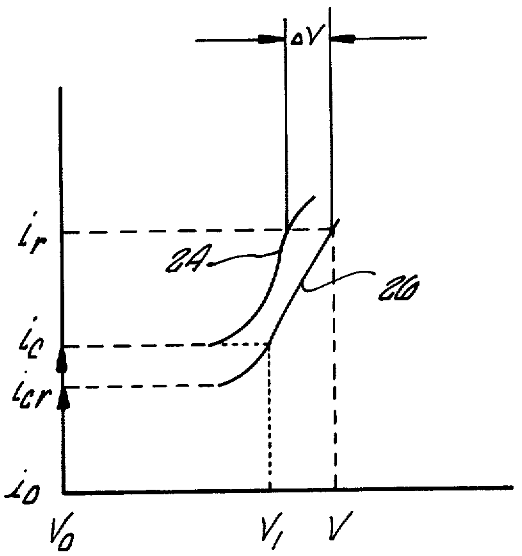
FIG. 4 is an illustrative schematic of the V–I characteristic of a Josephson junction with an active molecular species.

It should be realized that FIG. 4 is only for illustration purposes to disclose the effects of modulation of the Josephson junction characteristics. The theoretical work on the response of an active Josephson junction to infrared radiation using a modified transfer-Hamiltonian model of the junction indicates that, when the level spacing of an active molecular species site in the barrier region is resonant with the incident radiation, the voltage steps of a V-I curve will fall on top of the normal Josephson voltage steps and the amplitude of the voltage steps will be enhanced. Reference is made to the Physical Review article cited above, "Theory of Photon Assisted Tunnelling and Superconducting Junctions with Active Barrier Impurities" for a detail review of the theory, it is sufficient to note for our purposes that the effect of radiation on the tunneling electrons through the Josephson barrier region is taken into account using the Tien-Gordon approximation. Further, the effect of radiation on the infrared active molecular species barrier site is taken into account by assuming a non-zero probability of occupation of its excited levels. Temperature-dependent Green's functions are utilized in solving these approximations and if the radiation amplitude of these equations is made to vanish, the twice differentiated, $$\frac{d^2I}{dV^2},$$

characteristic displays the well known "Lambe-Jaklevic" peaks that suggest the spectrum of an active site in the barrier region. For non-zero values of the radiation amplitude, our calculation indicates that a Lambe-Jaklevic peak will decrease in amplitude for radiation having photon energy greater than the peak. Furthermore, if the radiation is capable of exciting a particular Lambe-Jaklevic peak, that peak will appear again at a lower voltage. The amplitude of this displaced peak depends, however, on the magnitude of the coupling of the tunneling electrons to the active site. Thus, measurement of the peaks will indicate the modulation effect of the dopant molecular species.

The effects on the current-voltage characteristic of the Josephson junction have been described as perturbations by the radiation on the unperturbed characteristic determined by the site. Conversely, the characteristic of the irradiated active junction can be analyzed in terms of the effect of an active site on the pure radiation characteristic. As is well known, this radiation characteristic manifests so-called "voltage steps". At voltages below the voltage corresponding to the superconducting energy gap of the electrodes, these steps are the Josephson steps, and above the voltage, the steps are the photon-assisted tunneling or single-particle steps. Our present calculation shows that the effect of an active site on the characteristic is the addition of new Josephson and single particle steps displaced from the original steps. Again the amplitude of these new features depends on the coupling of the tunneling electrons to the active sites. When the level spacing of a site is resonant with the incident radiation, the additional steps fall on top of the original ones, and the amplitude of the steps appear to be enhanced. However, the actual enhancement depends not only on the strength of the electron-site coupling but also on the strength of the coupling of the radiation to the site.

The radiation incident on the junction 18 can modulate, for example by diminishing as shown in curves 24 and 26 and critical current levels $i_c$ and $i_{cr}$ of FIG. 4, the maximum amount of zero-voltage current that can flow through the junction 18 and accordingly provide a measurable voltage differential $\Delta V$. The resulting output voltage signal can be suitably amplified by a pre-amplifier 28 and a lock-in amplifier 30.

In the schematic arrangement of FIG. 3, the incident radiation is chopped at about 100 Hz by a light chopper 32. A reference oscillator 34 drives the chopper motor 36. A light pipe or waveguide 38 focuses the light or energy beam down the light pipe into the liquid helium Dewar 40. The junction 18 is actually mounted transverse to the waveguide 38, although for purposes of illustration it is disclosed 90° rotated in FIG. 3 to disclose a plan view instead of the actual side view that would be seen in an operative state.

A lock-in amplifier 30 rectifies the output voltage signal from the pre-amplifier 28 at the chopper frequency by receiving an input signal from the reference oscillator 34. An instrument, HR-8 LOCK-IN AMPLIFIER, capable of performing the operational function of the pre-amplifier 28 and the lock-in amplifier 30 can be purchased from Princeton Applied Research Corp., Priceton, N. J. A recorder 42 is capable of providing a plot of the rectified output voltage signal from the lock-in amplifier 30 as a function of the path difference in the Michelson interferometer 14. The output spectral frequency response of the doped Josephson junction detector 18 can be obtained by computing the Fourier transform of the interferogram from the recorder 42 with a digital computer circuit 44 as disclosed in an article by P. L. Richards, Journal of Opt. Soc. Amer., Vol. 54, p. 1474 (1964). Actually the output voltage signal can be processed by any type of appropriate utilization circuit or even a manual interpretation. Accordingly, further details are not warranted within the framework of the present invention.

Figure 6:
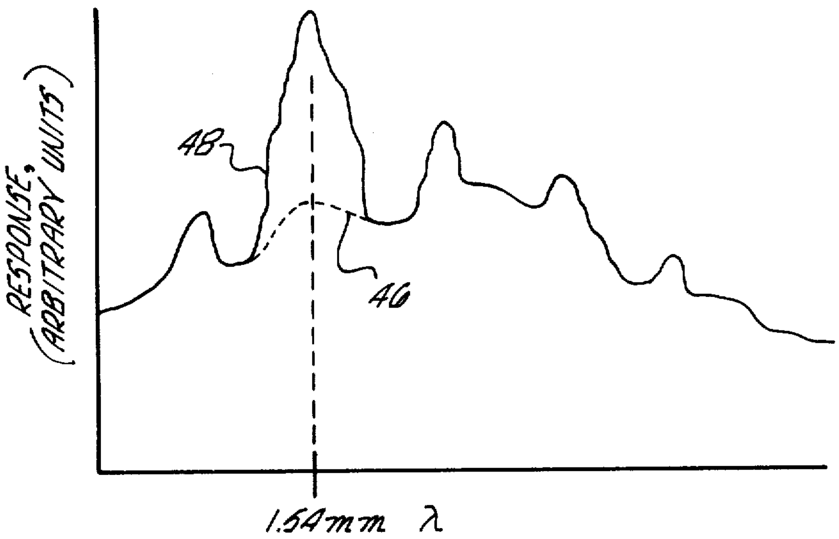
FIG. 6 is an illustrative schematic of a theoretical spectral response of a Josephson junction doped with water.
Figure 5:
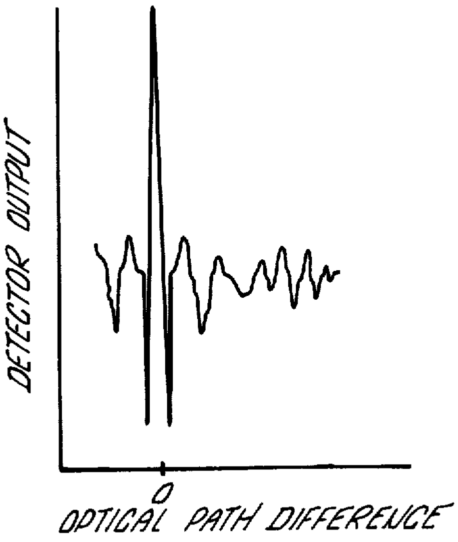
FIG. 5 is an illustrative schematic of a theoretical representative interferogram.

FIG. 5 discloses a schematic of a typical interferogram of experimental data. The curve is obtained by plotting the detector output voltage from the lock-in amplifier 30 versus the optical path difference of the Michelson interferometer 14. FIG. 6 discloses the spectral response of the Josephson junction detector 12 across a spectrum of frequency. The response is in arbitrary units and was obtained by computing the Fourier transform of the interferogram on the digital computer circuit 44. As can be seen from the dashed line 46, the expected response of the detector 12 without the presence of a dopant molecular species 8 in the junction 2 will not be particularly enhanced across the characteristic frequency of, for example, a water transition of 1.54 mm. However, with the physical adsorption of a molecular water species in the barrier region 6 the resultant coupling of incident radiation provides a significantly detectable characteristic response 48.

As an additional feature of the present invention, the barrier region 6 of the Josephson junction 2 can be extended beyond the upper electrode 10, as shown in FIG. 2, to act as an antenna for increasing the reception of the incident radiation. The incident radiation $\lambda$ would be directed at a preferred angle to be received and reflected between the internal surfaces of the barrier region.

An alternative method of detecting incident radiation on a doped Josephson junction would be to measure the effect of the radiation on the Josephson plasma frequency. Since the measurement would depend on frequency and not amplitude the detection would be extremely sensitive. The plasma frequency increases very sharply with the transmissivity of the junction barrier. It is possible to detect the plasma resonance of an irradiated Josephson junction by probing the junction with a small microwave field at a suitable frequency and observing a resonant response at the plasma frequency. The D. C. current of the junction can be used to sweep the plasma frequency past the microwave frequency in the same manner as a magnetic field is used to sweep a resonant frequency in a conventional magnetic resonance experiment. The microwave field is in the small-singal regime, e.g. $10^{-6}$ $^{145}$W input power level, to avoid hysteresic effects. The microwave signal would be applied to the Josephson junction and the second harmonic signal, e.g., in the range of $10^{-18}$ to $10^{-17}$ W power output, generated by the junction non-linearity would be detected. The second harmonic output signal can be detected by a phase-coherent detection system sensitive to both the phase and amplitude of the second harmonic voltage. The details of a plasma detection system can be found in an article "STUDY OF THE JOSEPHSON PLASMA RESONANCE" by DAHM et al., Physical Review Letters Vol. 20, No. 16, p. 859–863 (1968) and an article by Lewis and Carver, Phys. Rev. Vol. 155, p. 309 (1967), the contents of both articles being incorporated herein by reference.

As can be readily appreciated from FIG. 4, it is possible to bias the junction current to a critical current, $i_c$, that can be obtained absent the presence of any type of incident radiation and no voltage will be developed across the junction 2. When incident radiation characteristic of the molecular species is coupled into the barrier region 6 the critical current is reduced to $i_{cr}$ and if the bias current is held constant at $i_c$, a voltage $V_1$ likewise characteristic of the molecular species will be developed that can be utilzed as an output signal. It is also possible to directly measure the variation of the critical current with conventional equipment such as an ammeter 50 as an indication of the incident characteristic radiation. Since the presence of a broadband of radiation, per se, can diminish the critical current of a junction this technique of measurement is particularly applicable to an array detector composed of a number of junctions individually doped with different molecular species. The resulting sequential output from such an array will provide a characteristic trace of the incident radiation within the bandwidth of the array. The response of the array to known sources of radiation can determine the unknown molecular species present in the subject radiation trace.

The unknown source of radiation can be scanned individually across the array of junctions or applied directly at one time to all of the junctions. As disclosed in FIG. 3 each junction can be appropriately connected to means for indicating the respective presence of coupled incident radiation of a spectrum characteristic of the molecular species in each respective tunnel barrier. As is well known in the art the duplication of electronic equipment can be eliminated by appropriately sampling or electrically connecting the output signal of each junction in a sequential manner to the preamplifier 28.

While a preferred embodiment of the present invention has been described hereinabove, it is intended that all matter contained in the above description and shown in the accompanying drawings be interpreted as illustrative and not in a limiting sense and that all modifications, constructions, and arrangements which fall within the scope and spirit of the invention may be made.

What is claimed is:

1. A superconductive tunneling device capable of supporting Josephson tunneling current therethrough, comprising:

a first superconducting electrode;

a second superconducting electrode;

a tunnel barrier sufficiently thin to allow Josephson tunneling current therethrough located between said first and second electrodes; and means for increasing the sensitivity of said tunneling device to specific ranges of incident radiant energy including a molecular species added to the tunnel barrier and located between said first and second electrodes to form active coupling sites capable of coupling incident radiant energy of a spectrum characteristic of said molecular species into said tunnel barrier.

2. The superconductive tunneling device of claim 1 wherein said tunnel barrier is a frozen gas.

3. The superconductive tunneling device of claim 1 wherein said molecular species is approximately a monolayer of molecules.

4. The superconducting tunneling device of claim 1 wherein said tunnel barrier is an oxide of one of the electrode material.

5. The superconductive tunneling device of claim 1 wherein said first and second electrodes are lead and said tunnel barrier is lead oxide having a thickness in a range approximately between 0 and 50 Angstroms.

6. The superconductive tunneling device of claim 1 wherein said molecular species is a semi-conductor material between said electrodes.

7. The superconductive tunneling device of claim 1 further including an antennule attached to said tunnel barrier for directing incident radiant energy into said tunnel barrier.

8. The superconductive tunneling device of claim 7 wherein said antennule is a portion of said tunnel barrier extending beyond at least one of said electrodes.

9. The superconductive tunneling device of claim 2 wherein said frozen gas is inert.

10. The superconductive tunneling device of claim 2 wherein said frozen gas is argon.

11. The superconductive tunneling device of claim 2 wherein said molecular species is adsorbed onto said frozen gas.

12. The superconductive tunneling device of claim 2 wherein said molecular species is intermixed in an unbonded state throughout said tunnel barrier.

13. A radiation detecting apparatus capable of detecting a specific spectrum of incident radiation comprising:

a superconductive tunneling device having a first and second superconducting electrode and a tunnel barrier sufficiently thin to allow Josephson tunneling current therethrough located between said first and second electrodes;

means for increasing the sensitivity of said tunneling device to specific ranges of radiant energy including a molecular species added to the tunnel barrier and located between said first and second electrodes to form active coupling sites capable of coupling incident radiation of a spectrum characteristic of said molecular species into said tunnel barrier; and means for indicating the presence of said coupled incident radiation in said tunnel barrier.

14. The radiation detecting apparatus of claim 13 wherein said tunnel barrier is a frozen gas.

15. The radiation detecting apparatus of claim 13 wherein said molecular species is approximately a monolayer of molecules.

16. The radiation detecting apparatus of claim 13 wherein said first and second electrodes are lead and said tunnel barrier is lead oxide having a thickness in a range approximately between 0 and 50 Angstroms.

17. The radiation detecting apparatus of claim 13 wherein said tunnel barrier is an oxide of one of the electrode material.

18. The radiation detecting apparatus of claim 13 wherein said molecular species is a semi-conductor material between said electrodes.

19. The radiation detecting apparatus of claim 13 further including an antennule attached to said tunnel barrier for directing incident radiant energy into said tunnel barrier.

20. The radiation detecting apparatus of claim 14 wherein said frozen gas is inert.

21. The radiation detecting apparatus of claim 14 wherein said frozen gas is argon.

22. The radiation detecting apparatus of claim 14 wherein said molecular species is adsorbed onto said frozen gas.

23. The radiation detecting apparatus of claim 14 wherein said molecular species is intermixed in an unbonded state throughout said tunnel barrier.

24. The radiation detecting apparatus of claim 13 further including a plurality of said superconductive tunneling devices each having a different molecular species in their respective tunnel barrier forming an array and means for indicating the respective presence of coupled incident radiation of a spectrum characteristic of said molecular species in each respective tunnel barrier.

25. The radiation detecting apparatus of claim 13 wherein the means for indicating the presence of said coupled incident radiation in said tunnel barrier includes means for measuring a voltage signal.

26. The radiation detecting apparatus of claim 13 wherein the means for indicating the presence of said coupled incident radiation in said tunnel barrier includes means for measuring the plasma frequency of said tunnel barrier.

27. The radiation detecting apparatus of claim 13 wherein the means for indicating the presence of said coupled incident radiation in said tunnel barrier includes means for measuring the critical current.

28. The radiation detecting apparatus of claim 13 wherein the means for indicating the presence of said coupled incident radiation in said tunnel barrier includes means for sequentially applying said incident radiation and amplifier means connected to said sequential means for providing an output signal representative of the presence of said radiation.

29. A superconductive tunneling device capable of supporting Josephson tunneling current therethrough, comprising:

a first superconducting electrode;

a second superconducting electrode;

a frozen gas tunnel barrier sufficiently thin to allow Josephson tunneling current therethrough located between said first and second electrodes; and means for increasing the sensitivity of said tunneling device to incident radiant energy including a molecular species located between said first and second electrodes capable of coupling incident radiant energy of a spectrum characteristic of said molecular species into said tunnel barrier.

* * * * *